United States Patent [19]

Kawamura et al.

[11] Patent Number: 4,772,534
[45] Date of Patent: Sep. 20, 1988

[54] LIGHT SENSITIVE COMPOSITION CONTAINING A LIGHT SENSITIVE S-TRIAZINE COMPOUND

[75] Inventors: Kouichi Kawamura; Hirokazu Kondo; Yoshimasa Aotani, all of Kanagawa, Japan

[73] Assignee: Fuji Photo Film Co., Ltd., Kanagawa, Japan

[21] Appl. No.: 903,711

[22] Filed: Sep. 5, 1986

[30] Foreign Application Priority Data

Sep. 9, 1985 [JP] Japan .................................. 60-198868

[51] Int. Cl.$^4$ .......................... G03C 1/68; G03C 1/60; G03C 1/727; C07D 251/20
[52] U.S. Cl. ...................................... 430/176; 430/916; 430/920; 430/343; 430/179; 430/196; 430/270; 430/191; 430/292; 430/281; 522/16; 522/52; 522/63; 544/216
[58] Field of Search ............... 544/216; 430/916, 920, 430/343, 176; 522/16, 52, 63; 430/179, 196, 270, 191, 292, 281

[56] References Cited

U.S. PATENT DOCUMENTS

| | | |
|---|---|---|
| 4,160,671 | 7/1979 | Stahlhofen .......................... 430/191 |
| 4,239,850 | 12/1980 | Kita et al. .......................... 522/16 X |
| 4,258,123 | 3/1981 | Nagashima et al. ................. 430/916 |
| 4,458,000 | 7/1984 | Stahlhofen .......................... 430/191 |
| 4,619,998 | 10/1986 | Buhr .................................... 544/216 |
| 4,631,247 | 12/1986 | Tise .................................. 430/270 X |

Primary Examiner—Paul R. Michl
Assistant Examiner—Cynthia Hamilton
Attorney, Agent, or Firm—Burns, Doane Swecker & Mathis

[57] ABSTRACT

A light-sensitive composition containing a novel light-sensitive s-triazine compound represented by the formula (I) as a free radical-generating agent is disclosed. The s-triazine compound responds radiation in the range of the near ultraviolet to visible light, shows high sensitivity for photolysis and, therefore, the compositon has high light-sensitivity.

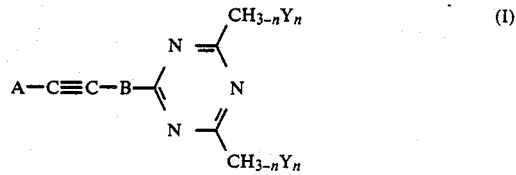

22 Claims, No Drawings

LIGHT SENSITIVE COMPOSITION CONTAINING A LIGHT SENSITIVE S-TRIAZINE COMPOUND

FIELD OF THE INVENTION

This invention relates to a light-sensitive composition containing a compound capable of generating a free radical upon exposure to light. More particularly, it relates to a light-sensitive composition containing a novel light-sensitive s-triazine compound.

BACKGROUND OF THE INVENTION

Compounds capable of generating a free radical through decomposition upon exposure to light (hereinafter referred to as "free radical-generating agents") are well known in the field of graphic arts. They have been widely used as photopolymerization initiators in photopolymerizable compositions, photoactivating agents in compositions for free radical photography, and photo initiators for reaction systems that are catalyzed by acids generated by light. By using these free radical-generating agents, various light-sensitive materials can be produced that are useful in printing, duplication, copying and other image formation systems.

Organic halogen compounds are capable of forming a halogen free radical, such as a chlorine free radical and a bromine free radical, upon photolysis. The thus formed free radicals are satisfactory agents for drawing hydrogen and form acids in the presence of hydrogen donors. Applications of these organic halogen compounds to photopolymerization system of free radical photography are described in J. Kosar, *Light Sensitive Systems*, pp. 180–181 and 361–170, J. Wiley & Sons (New York, 1965).

Known compounds that generate halogen free radicals by the action of light and have widely been employed typically include carbon tetrachloride, iodoform, tribromoacetophenone and the like. However, these free radical-generating agents have a disadvantage in that they decompose with light of a considerably limited wavelength region. In other words, these compounds respond only to the ultraviolet region having shorter wavelengths than main wavelengths of commonly employed light sources. Therefore, they have poor capability of forming free radicals because of their inability to effectively utilize light in the range of from near ultraviolet to visible light.

In order to overcome the above-described disadvantage, it has been proposed to broaden the sensitive wavelength region by incorporating certain types of sensitizers, such as merocyanine dyes, styryl bases, and cyanine bases, as disclosed in U.S. Pat. Nos. 3,106,466 and 3,121,633. Although the incorporation of these sensitizers certainly succeeded in broadening the sensitive wavelength region of carbon tetrachloride or iodoform, the results were still unsatisfactory. This is because it was difficult to select such a sensitizer that exhibits good compatibility with the free radical-generating agent or other elements of a light-sensitive composition and also has high sensitivity.

Halogen free radical-generating agents sensitive to the near ultraviolet to visible light have been proposed in order to overcome the above-described problem. For example, U.S. Pat. Nos. 3,954,475, 3,987,037, and 4,189,323 disclose halomethyl-s-triazine compounds. These compounds respond to the near ultraviolet to the visible light region. However, their sensitivity for photolysis is relatively low since the irradiated light cannot be effectively absorbed.

Accordingly, there is a continuing problem that free radical-generating agents having senstivity to the near ultraviolet region to the visible region are still too low in photolysis sensitivity, and thus the sensitivity of the light-sensitive compositions containing them have not been as high as desired.

SUMMARY OF THE INVENTION

Accordingly, an object of this invention is to provide a light-sensitive composition containing a free radical-generating agent which is high in photolysis sensitivity and therefore, being high in sensitivity.

As a result of extensive investigations, it has now been found that the above-described problem can be overcome by a light-sensitive composition containing an s-triazine compound represented by the formula (I):

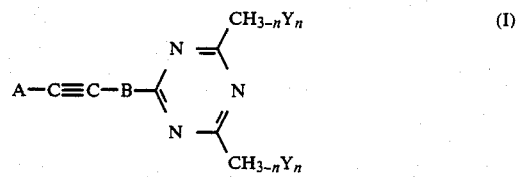

wherein A and B represent a substituted or unsubstituted aromatic group or a substituted or unsubstituted heteroaromatic group; Y represents a chlorine atom or a bromine atom; and n represents an integer of from 1 to 3.

It was also found that the s-triazine compound of formula (I) exhibits good compatibility with other components of light-sensitive compositions.

DETAILED DESCRIPTION OF THE INVENTION

In the above-described formula (I), the aromatic or heteroaromatic group represented by A preferably is a monocyclic or bicyclic group. Examples of such groups include a phenyl group, a 1-naphthyl group, a 2-naththyl group, a 2-furyl group, a 2-thienyl group, a 2-oxazole group, a 2-thiazole group, a 2-imidazole group, a 2-pyridyl group, a 2-benzofuryl group, a 2-benzothienyl group, a 2-benzoxazole group, a 2-benzothiazole group, a 2-benzimidazole group, a benzotriazole group, a 2-indolyl group, a 2-quinolyl group, and the like. Of these, monocyclic aryl groups are preferred.

Examples of the aromatic or heteroaromatic group represented by B include 1,4-phenylene group, 1,2-phenylene group, 1,3-phenylene group, 1,4-naphthylene group, 1,5-naphthylene group, 2,3-thienylene group, 2,5-thienylene group and the like. Of these, monocyclic arylene groups are preferred.

The substituted aromatic or heteroaromatic group represented by A or B includes the above-enumerated aromatic or heteroaromatic groups substituted with an alkyl group having 1 to 6 carbon atoms, e.g., methyl group or ethyl group, an alkoxy group having 1 to 6 carbon atoms, e.g., methoxy group or ethoxy group, a halogen atom, e.g., a chlorine atom, a nitro group, a phenyl group, a carboxyl group, a hydroxyl group, a cyano group, etc. Specific examples of the substituted aromatic groups represented by A are a 4-chlorophenyl group, a 2-chlorophenyl group, a 2,6-dichlorophenyl group, a 4-bromophenyl group, a 4-nitrophenyl group, a 3-nitrophenyl group, a 4-phenylphenyl group, a 4-methylphenyl group, a 4-isopropylphenyl group, a 2-methylphenyl group, a 4-ethylphenyl group, a 4-isopropylphenyl group, a 4-butylphenyl group, a 4-methoxyphenyl group, a 2-methoxyphenyl group, a 3-methoxyphenyl group, a 4-ethoxyphenyl group, a 4-n-butoxyphenyl group, a 2-carboxyphenyl group, a 4-cyanophenyl group, a 3,4-methylene-dioxyphenyl group, a 4-phenoxyphenyl group, a 4-actoxyphenyl group, a 4-hydroxyphenyl group, a 2,4-dihydroxyphenyl group, a 4-methyl-1-naphthyl group, a 4-chloro-1-naphthyl group, a 5-nitro-1-naphthyl group, a 6-chloro-2-naphthyl group, a 4-bromo-2-naphthyl group, a 5-nitro-2-naphthyl group, a 6-methyl-2-benzofuryl group, a 6-methyl-2-benzoxazole group, a 6-methyl-2-benzothiazole group, a 6-chloro-2-benzothiazole group, a 2-thienyl group, a 3-thienyl group, a 2-furyl group, a 3-furyl group, a 2-benzofuryl group, 5-(1,3-dihydroisobenzofuranyl) and the like. Of these, monocyclic substituted aromatic groups are preferred.

The s-triazone compounds represented by the formula (I) can be synthesized by cyclizing an aromatic nitrile compound represented by the formula (II) below and a haloacetonitrile in accordance with the method described in K. Wakabayashi et al., *Bulletin of the Chemical Society of Japan*, Vol. 42, pp. 2924–2930 (1969).

The compounds represented by the formula (II) can be prepared by the methods disclosed L. I. Smith et al., *Organic Syntheses*, Collective Volume 3, pp. 350–351, J. Wiley & Sons and K. Yoshida et al., *Chemical Communications*, 711 (1970).

A—C≡C-B—CN      Formula (II)

wherein A and B have the same meaning as defined in the formula (I).

Specific examples of free radical-generating agents that can be used in the present invention to advantage are shown below:

No. 1

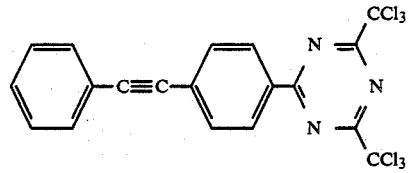

No. 2

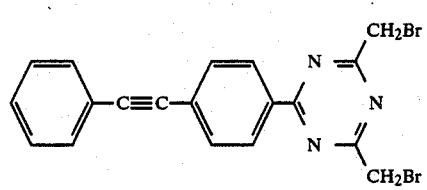

No. 3

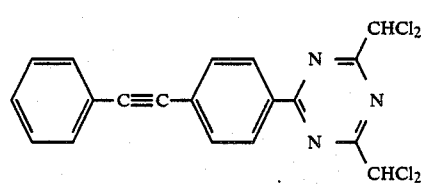

No. 4

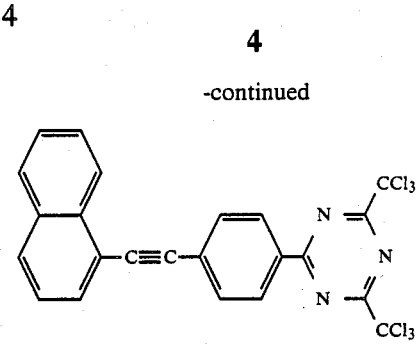

No. 5

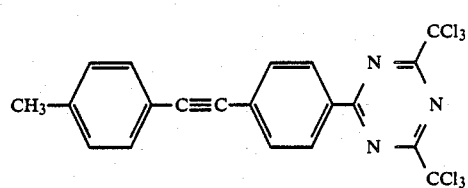

No. 6

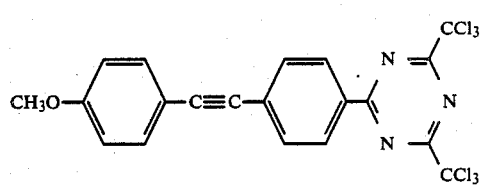

No. 7

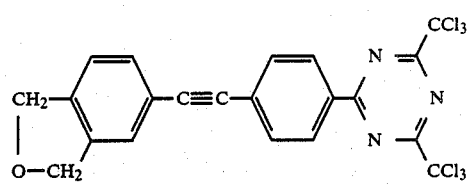

No. 8

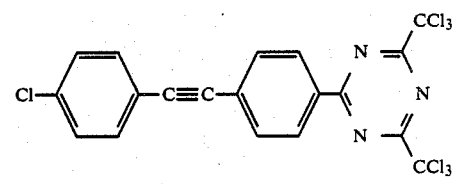

No. 9

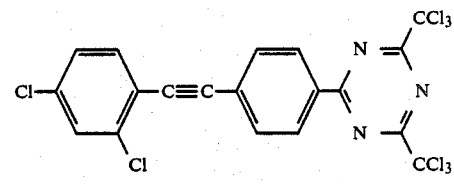

No. 10

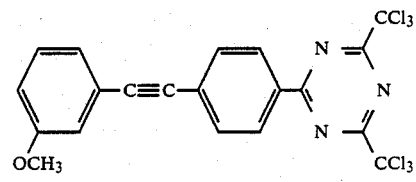

The free radical-generating agents represented by the formula (I) are particularly useful when applied to photopolymerizable compositions as photopolymerization initiators or to photosensitive resist-forming compositions for producing lithographic printing plates, IC circuits, or photomasks as agents for imparting an ability to produce a visible image upon exposure to light without development.

The photopolymerizable composition to which the free radical-generating agent represented by formula (I) can be applied comprises a polymerizable compound having an ethylenically unsaturated bond and a photopolymerization initiator, and, if appropriate, a binder, and further optionally, a sensitizer, and is useful for light-sensitive layers of presensitized printing plates, photo-resists, and the like.

The polymerizable compounds having an ethylenically unsaturated bond which can be used in the photopolymerizable composition according to the present invention are those having at least one ethylenically unsaturated bond in their chemical structure and include monomers, prepolymers, i.e., dimers, trimers and other oligomers, mixtures thereof and copolymers thereof. Examples of such polymerizable compounds are unsaturated carboxylic acids and their derivatives, such as salts, esters with aliphatic polyhydric alcohol compounds and amides with aliphatic polyamine compounds.

Specific examples of the unsaturated carboxylic acids include acrylic acid, methacrylic acid, itaconic acid, crotonic acid, isocrontonic acid, maleic acid, and the like.

The salts of unsaturated carboxylic acids include sodium salts and potassium salts of the above-recited acids.

The esters of aliphatic polyhydric alcohol compounds and the unsaturated carboxylic acids include acrylic esters, such as ethylene glycol diacrylate, triethylene glycol diacrylate, 1,3-butanediol diacrylate, tetramethylene glycol diacrylate, propylene glycol diacrylate, trimethylolpropane triacrylate, trimethylolethane triacrylate, 1,4-cyclohexanediol diacrylate, tetraethylene glycol diacrylate, pentaerythritol diacrylate, pentaerythritol triacylate, pentaerythritol tetraacrylate, dipentaerythritol diacrylate, dipentaerythritol triacrylate, dipentaerythritol tetraacrylate, dipentaerythritol hexaacrylate, sorbitol triacrylate, sorbitol tetraacrylate, sorbitol pentaacrylate, sorbitol hexaacrylate, polyester acrylate oligomers, etc.; methacrylic esters, such as tetramethylene glycol dimethacrylate, triethylene glycol dimethacrylate, trimethylolpropane trimethacrylate, trimethylolethane trimethacrylate, ethylene glycol dimethacrylate, 1,3-butanediol dimethacrylate, pentaerythritol dimethacrylate, pentaerythritol trimethacrylate, dipentaerythritol dimethacrylate, sorbitol trimethacrylate, sorbitol tetramethacrylate, bis-[p-(3-methacryloxy-2-hydroxypropoxy)phenyl] dimethylmethane, bis-[p-(acryloxyethoxy)phenyl] dimethylmethane, etc.; itaconic esters, such as ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc.; crotonic acid esters, such as ethylene glycol dicrontonate, tetramethylene glycol dicrotonate, pentaerythritol dicrotonate, sorbitol tetracrotonate, etc.; isocrotonic acid esters, such as ethylene glycol diisocrotonate, pentaerythritol diisocrotonate, sorbitol tetraisocrotonate, etc.; and maleic acid esters, such as ethylene glycol dimaleate, triethylene glycol dimaleate, pentaerythritol dimaleate, sorbitol tetramaleate, etc. Mixtures of these esters may also be used.

The amides of the aliphatic polyamide compounds and the unsaturated carboxylic acids include methylenebisacrylamide, methylenebis-methacrylamide, 1,6-hexamethylenebisacrylamide, 1,6-hexamethylenebismethacrylamide, diethylenetriaminetrisacrylamide, xylylenebisacrylamide, xylylenebismethacrylamide, and the like.

Other examples of useful polymerizable compounds include vinyl urethane compounds having at least two polymerizable vinyl groups per molecule that are obtained by addition of a vinyl monomer containing a hydroxyl group represented by formula (III) below to a polyisocyanate compound having at least two isocyanate groups per molecule, such as those disclosed in Japanese Patent Publication No. 41708/73.

Formula (III) is represented by;

$$CH_2=C(R)COOCH_2CH(R')OH \qquad (III)$$

wherein R and R' each represents a hydrogen atom or a methyl group.

If desired, the photopolymerizable composition in which the free radical-generating agent represented by the formula (I) is used as a photopolymerization initiator, it may contain a binder.

The binder which can be used in the photopolymerizable composition according to the present invention, is required to show compatibility both to the polymerizable ethylenically unsaturated compound and the photopolymerization initiator to such an extent that it does not cause separation of the mixture throughout the process for producing light-sensitive materials from formulation of a coating solution through coating followed by drying. It is further required to provide a light-sensitive layer or resist layer which can be subjected to development processing after imagewise exposure either by solution development or stripping development. It is furthermore required to provide a rigid film as a light-sensitive layer or a resist layer. The binder which can satisfy these requirement is appropriately selected from linear organic high polymers. Specific examples of the binder include chlorinated polyethylene, chlorinated polypropylene, polyalkyl acrylates (the alkyl group includes a methyl group, an ethyl group, an n-butyl group, an isobutyl group, an n-hexyl group, a 2-ethylhexyl group, etc.), copolymers of an alkyl acrylate (the alkyl group is the same as enumerated above) and at least one monomer, e.g., acrylonitrile, vinyl chloride, vinylidene chloride, styrene, butadiene and the like, polyvinyl chloride, a copolymer of vinyl chloride and acrylonitrile, polyvinylidene chloride, a copolymer of vinylidene chloride and acrylonitrile, polyvinyl acetate, polyvinyl alcohol, polyacrylonitrile, a copolymer of acrylonitrile and styrene, a copolymer of acrylonitrile, butadiene and styrene, polyalkyl methacrylate (the alkyl group includes a methyl group, an ethyl group, an n-propyl group, an n-butyl group, an isobutyl group, an n-hexyl group, a cyclohexyl group, a 2-ethylhexyl group, etc.), a copolymer of an alkyl methacrylate (the alkyl group is the same as enumerated above) and at least one monomer, e.g., acrylonitrile, vinyl chloride, vinylidene chloride, styrene, butadiene, etc., polystyrene, poly-α-methylstyrene, polyamides (e.g., 6-nylon, 6,6-nylon etc.), methyl cellulose, ethyl cellulose, acetyl cellulose, polyvinyl formal, polyvinyl butyral, and the like. In addition, the use of a water or alkaline water soluble organic high polymer makes it possible to develop the resulting light-sensitive material after exposure with water or an alkaline developing solution. Such a high polymer includes addition polymers having a carboxyl group in their side chain, such as methacrylic acid copolymers (e.g, a copolymer of methyl methacrylate and methacrylic acid, a copolymer of ethyl methacrylate and methacrylic acid, a copolymer of butyl methacrylate and methacrylic acid, a copolymer of ethyl acrylate and methacrylic acid, a copolymer of methacrylic acid, styrene and methyl methacrylate, a copolymer of allyl methacrylate and methacrylic acid etc.), acrylic acid copolymers (e.g, a copolymer of ethyl acrylate and acrylic acid, a copolymer of butyl acrylate and acrylic acid, a copolymer of ethyl acrylate, styrene and acrylic acid, etc.), itaconic acid copolymers, crotonic acid copolymers and partially esterified maleic acid copolymers as well as acidic cellulose derivatives having a carboxyl group in their side chain.

These high polymers may be used alone, but they can also be used as a mixture of two or more thereof, each having mutual compatibility sufficient to be free from separation in the whole process from the formulation of a coating solution through the coating and the subsequent drying, at an appropriate mixing ratio.

The high polymer which can be used as a binder may have a widely ranging molecular weight according to the particular kind. In general, the molecular weight of the high polymer preferably ranges from 5,000 to 2,000,000, and particularly from 10,000 to 1,000,000.

The sensitizer which may be optionally contained in the photopolymerizable composition according to the present invention is selected from compounds that enhance the rate of photopolymerization when used in combination with the photopolymerization initiator of formula (I). Examples of such a sensitizer include benzoin, benzoin methyl ether, benzoin ethyl ether, 9-fluorenone, 2-chloro-9-fluorenone, 2-methyl-9-florenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloror-9,10-anthraquinone, xanthone, 2-methylxanthone, 2-methoxyxanthone, thioxanthone, benzil, dibenzalacetone, p-(dimethylamoni)pnehyl styryl ketone, p-(dimethylamino)phenyl p-methylstyryl ketone, benzophenone, p-(dimethylamino)benzophenone (or Michler's ketone), p-(diethylamino)benzophenone, benzanthrone, and the like. Of these compounds, Michler's ketone is particularly preferred.

Other preferred sensitizers usable in the present invention include compounds represented by the formula (IV) described in Japanese Patent Publication No. 48516/76 which corresponds to U.S. Pat. No. 3,870,524.

Formula (IV) is represented by;

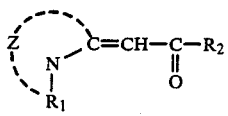

(IV)

wherein $R_1$ represents an alkyl group (e.g., a methyl group, an ethyl group, a propyl group, etc.) or a substituted alkyl group (e.g., a 2-hydroxyethyl group, a 2-methoxyethyl group, a carboxymethyl group, a 2-carboxyethyl group, etc.); $R_2$ represents an alkyl group (e.g., a methyl group, an ethyl group, etc.) or an aryl group (e.g., a phenyl group, a p-hydroxyphenyl group, a naphthyl group, a thienyl group, etc.); and Z represents a non-metallic atomic group forming a nitrogen-containing heterocyclic ring employed in cyanine dyes and specifically includes, for examples, benzothiazoles (e.g., benzothiazole, 5-chlorobenzothiazole, 6-chlorobenzothiazole, etc.), naphthothiazoles (e.g, α-naphtothiazole, β-naphtothiazole, etc.), benzoselenazoles (e.g, benzoselenazole, 5-chlorobenzoselenazole, 6-methoxybenzoselenazole, etc.), naphthoselenazoles (e.g., α-naphthoselenazole, β-naphthoselenazole, etc.), benzoxazoles (e.g, benzoxazole, 5-methylbenzoxazole, 5-phenylbenzoxazole, etc.) and naphthoxazoles (e.g., α-naphthoxazole, β-naphthoxazole, etc.).

Many of the compounds represented by the above-described formula (IV) are known as described in U.S. Pat. No. 3,870,524, and specific examples of the sensitizers (IV) can be appropriately selected from such known compounds.

Still other preferred sensitizers which can be used in the present invention include those sensitizers disclosed in U.S. Pat. No. 4,062,686, such as 2- bis(2-furoyl)-methylene -3-methylbenzothiazoline, 2- bis(2-thenoyl)-methylene -3-methylbenzothiazoline, 2- bis(2-furoyl)-methylene -3-methylnaphtho 1,2-d thiazoline, and the like.

For the purpose of inhibiting unnecessary heat polymerization of the polymerizable compound having an ethylenically unsaturated bond during preparation or preservation of the composition of this invention, it is desirable to add a heat polymerization inhibitor to the composition. Examples of suitable heat polymerization inhibitor are hydroquinone, p-methoxyphenol, di-t-butyl-p-cresol pyrogallol, t-butylcatechol, benzoquinone, cuprous chloride, phenothiazine, chloranil, naphthylamine, β-naphthol, nitrobenzene, dinitrobenzene, and the like.

In some cases, the composition according to the present invention may contain dyes or pigments for the purpose of coloring, such as Methylene Blue, Crystal Violet, Rhodamine B, Fuchsine, Auramine, azo dyes, anthraquinone dyes, titanium oxide, carbon black, iron oxide, phthalocyanine pigments, azo pigments, and the like.

The photopolymerizable composition according to the present invention may further contain, if desired, a plasticizer. Examples of usable plasticizers are phthalic esters, e.g., dimethyl phthalate, diethyl phthalate, dibutyl phthalate, dihexyl phthalate, dicyclohexyl phthalate, ditridecyl phthalate, etc.; glycol esters, e.g., dimethylglycol phthalate, ethylphthalyl ethylglycolate, butylphthalyl butylglycolate, etc.; phosphoric esters, e.g., tricresyl phosphate, triphenylphosphate, etc.; aliphatic dibasic acid esters, e.g, diisobutyl adipate, dioctyl adipate, dibutyl sebacate, dibutyl malate, etc.; and the like.

The photopolymerizable composition of the present invention is dissolved in an appropriate solvent and coated on a support by a known coating method. Preferred and particularly preferred ratios of the components constituting the photopolymerizable composition are shown below in terms of parts by weight per 100 parts by weight of the polymerizable compound having an ethylenically unsaturated bond.

| Component | Preferred Ratio | Particularly Preferred Ratio |
|---|---|---|
| Free radical-generating agent of the formula (I) | 0.01 to 50 | 0.1 to 10 |
| Binder | 0 to 1,000 | 0 to 500 |
| Sensitizer | 0 to 100 | 0 to 20 |
| Heat polymerization inhibitor | 0 to 10 | 0 to 5 |
| Dye or pigment | 0 to 50 | 0 to 20 |

| Component | Preferred Ratio | Particularly Preferred Ratio |
|---|---|---|
| Plasticizer | 0 to 200 | 0 to 50 |

The photosensitive resist-forming composition in which the free radical-generating agent represented by formula (I) is used, can produce a visible image upon exposure under a yellow safelight. Thus, in processes involving, for example, simultaneous exposure of a number of presensitized plates, it is possible for workers to distinguish between the exposed plates and the unexposed plates, when, for example, the operation of light exposure has been suspended.

When a large-sized plate is repeatedly exposed to light as in the so-called step and repeat printing down method for the production of lithographic printing plates, it is likewise possible for workers to instantly ascertain which area has been exposed.

The photosensitive resist-forming composition which provides a visible image immediately upon exposure to light and in which the free radical-generating agent of formula (I) is advantageously employed, usually comprises, as essential components, a photosensitive resist-forming compound, a free radical-generating agent and a color changing agent, and, as optional components, one or more plasticizers, a binder, a dye or a pigment other than the color changing agent, an antifoggant, a sensitizer for the photosensitive resist-forming compound, and the like.

The photosensitive resist-forming compound is capable of changing its physical properties, such as solubility, tackiness, adhesion to a support and so on, and includes light-sensitive diazo compounds, light-sensitive azide compounds, compounds having an ethylenically unsaturated bond, and compounds that are catalyzed by an acid generated by light.

Suitable light-sensitive diazo compounds include compounds having two or more diazo groups per molecule, such as condensates between p-diazodiphenylamine salts, e.g., a phenol salt, a fluorocaprate, etc., or sulfonates, e.g., salts of triisopropylnaphthalenesulfonic acid, 4,4'-bisphenyldisulfonic acid, 5-nitro-o-toluenesulfonic acid, 5-sulfosalicylic acid, 2,5-dimethylbenzenesulfonic acid, 2-nitrobenzenesulfonic acid, 3-chlorobenzenesulfonic acid, 3-bromobenzenesulfonic acid, 2-chloro-5-nitrobenzenesulfonic acid, 2-fluorocaprylnaphthalenesulfonic acid, 1-naphthol-5-sulfonic acid, 2-methoxy-4-hydroxy-5-benzoylbenzenesulfonic acid, p-toluenesulfonic acid, etc.; and formaldehyde. Other preferred diazo compounds include condensates between 2,5-dimethoxy-4-p-tolymercaptobenzenediazonium containing the above-enumerated salts and formaldehyde, and a condensate between 2,5-dimethoxy-4-morpholinobenzenediazonium and formaldehyde or acetaldehyde.

Additional useful diazo compounds include the compounds described in U.S. Pat. No. 2,649,373.

These diazo compounds are insolublized by decomposition of diazo groups upon irradiation by actinic light.

Further, light-sensitive diazo compounds that turn to be alkali-soluble upon irradiation with actinic light can also be used. They carry at least one o-quinonediazido group per molecule, and preferably include sulfonic acid esters or sulfonic acid amides of o-quinonediazide. Many such compounds are known, specific examples being described, e.g., in U.S. Pat. Nos. 3,046,110, 3,046,111, 3,046,115, 3,046,119, 3,046,120, 3,046,121, 3,046,122, 3,102,809, 3,130,047, 3,130,048, 3,148,983, 3,184,310, 3,188,210, 3,454,400 and 3,859,099.

Suitable light-sensitive azide compounds are aromatic azide compounds in which an azido group is bonded to an aromatic ring directly or via a carbonyl group or a sulfonyl group. Photolysis of the azido group of these compounds form a nitrene, and various reactions of the nitrene result in insolubilization of the compounds. Preferred aromatic azide compounds are those containing one or more of azidophenyl, azidostyryl, azidobenzal, azidobenzoyl and azidocinnamoyl groups. Specific examples of such compounds include 4,4'-diazidochalcone, 4-azido-4'-(4-azidobenzoylethoxy)chalcone, N,N-bis-p-azide, benzel-p-penylenediamine, 1,2,6-tri(4'-azidobenzoxy)hexane, 2-azido-3-chloro-benzoquinone, 2,4-diazido-4'-ethoxyazobenzene, 2,6-di(4'-azidobenzal)-4-methycyclohexanone, 4,4'-diazidobenzophenone, 2,5-diazido-3,6-dichlorobenzoquinone, 2,5-bis(4-azidostyryl)-1,3,4-oxadiazole, 2-(4-azidocinnamoyl)thiophene, 2,5-di(4-azidobenzal)cyclohexanone, 4,4'-diaziodphenylmethane, 1-(4-azidophenyl)-5-furyl-2-penta-2,4-dien-1-one, 1-(4-azidophenyl)-5-(4-methoxyphenyl)penta-1,4-dien-3-one, 1-(4-azidophenyl)-3-(1-naphthyl)-propen-1-one, 1-(4-azidophenyl)-3-(4-dimethylaminophenyl)-propan-1-one, 1-(4-azidophenyl-5-phenyl-1,4-pentadien-3-one, 1-(4-azidophenyl)-3-(4-nitrophenyl)-2-propen-1-one, 1-(4-azidophenyl)-3-(2-furyl)-2-propen-1-one, 1,2,6-tri(4'-azidobenzoxy)hexane, 2,6-bis(4-azidobenzylidyne-p-t-butyl)cyclohexanone, 4,4'-diaziodobenzalacetone, 4,4'-diazidostilbene-2,2'-disulfonic acid, 4'-azidobenzalacetophenone-2-sulfonic acid, 4,4'-diazidostilbene-α-carboxylic acid, di(4-azido-2'-hydroxybenzal)acetone-2-sulfonic acid, 4-azidobenzalacetophenone-2-sulfonic acid, 2-azido-1,4-dibenzenesulfonylaminonaphthalene, 4,4'-diazidostilbene-2,2'-disulfonic acid anilide, and the like.

In addition to these low molecular weight aromatic azide compounds, the azido group-containing polymers described in Japanese Patent Publication Nos. 9047/69, 31837/69, 9613/70, 24915/70 and 25713/70 are also suitably employed.

Suitable compounds having an ethylenically unsaturated bond include polymers crosslinkable by photodimerization of the ethylene bond and polymerizable compounds which are photopolymerized in the presence of a photopolymerization initiator to form an inactive polymer.

The polymers having an ethylenically unsaturated bond and insolubilizable by photodimerization include polyesters, polyamides and polycarbonates containing

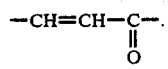

Examples of such polymers are light-sensitive polymers containing a light-sensitive group in their polymer main chain such as those disclosed in U.S. Pat. Nos. 3,030,208 and 3,707,373, e.g., a light-sensitive polyester consisting of p-phenylene-diacrylic acid and a diol; the light-sensitive polymers disclosed in U.S. Pat. Nos. 2,956,878 and 3,173,787, e.g., a light-sensitive polyester derived from a 2-propylidenemalonic acid compound (e.g., cinnamylidenemalonic acid, etc.) and a difunctional glycol; and the light-sensitive polymers disclosed in U.S. Pat.

Nos. 2,690,966, 2,752,372 and 2,732,301, e.g., cinnamic esters of hydroxyl-containing polymers (e.g., polyvinyl alcohol, starch, cellulose and their analogues).

The polymerizable compounds which are photopolymerized to form inactive polymers include those enumerated as a component of the foregoing photopolymerizable compositions.

The color changing agents which can be used for preparing photosensitive resist-forming compositions capable of forming a visible image only by exposure include two types, one of which is essentially colorless but becomes colored by the action of a photolysis product of a free radical-generating agent, the other of which has an inherent color but is decolored or discolored by the action of a photolysis product of a free radical-generating agent.

Typical color changing agents belonging to the former type are arylaminese which include not only acrylamines, such as primary and secondary aromatic amines, but also the so-called leuco dyes. Specific examples of such arylamines include diphenylamine, dibenzylaniline, triphenylamine, diethylaniline, diphenyl-p-phenylenediamine, p-toluidine, 4,4'-biphenyldiamine, o-chloroaniline, o-bromoaniline, 4-chloror-o-phenylenediamine, o-bromo-N,N-dimethylaniline, 1,2,3-triphenylguanidine, naphthylamine, diaminodiphenylmethane, aniline, 2,5-dichloroaniline, N-methyldiphenylamine, o-toluidine, p,p'-tetramethyldiaminodiphenylmethane, N,N-dimethyl-p-phenylenediamine, 1,2-dianilinoethylene, p,p',p"-hexamethyltriaminotriphenylmethane, p,p'-tetramethyldiaminotriphenylmethane, p,p'-tetramethyldiaminodiphenylmethylimine, p,p',p"-triamino-o-methyltriphenylmethane, p,p',p"-triaminotriphenylcarbinol, p,p'-tetramethylaminodiphenyl-4-anilinonaphthylmethane, p,p',p"-triaminotriphenylmethane, p,p',p"-hexampropyltriaminotriphenylmethane, etc.

The color changing agents belonging to the latter type, the inherent color of which is decolored or discolored by a photolysis product of a free radical-generating agent, include various dyes, such as diphenylmethane, triphenylmethane type thiazine, oxazine type, xanthene type, anthraquinone type, iminonaphthoquinone type, azomethine type, and the like.

Specific examples of such dyes include Brilliant Green, Eosine, Ethyl Violet, Erthyrocin B, Methyl Green, Crystal Violet, Basic Fuchsine, phenolphthalein, 1,3-diphenyltriazine, Alizarin Red S, Thymolphthalein, Methyl Violet 2B, Quinaldine Red, Rose Bengale, Metanil Yellow, Thymolsulfophthaline, Xylenol Blue, Methyl Orange, Orange IV, diphenyl thiocarbazone, 2,7-dichlorofluorescein, Para Methyl Red, Congo Red, Benzopurpurine 4B, α-Naphthyl Red, Nile Blue 2B, Nile Blue A, Phenacetarin, Methyl Violet, Malachite Green, Para Fuchsine, Oil Blue #603 (produced by Orient Chemical Industries, Ltd.), Oil Pink #312 (produced by Orient Chemical Industries, Ltd.), Oil Red 5B (produced by Orient Chemical Industries, Ltd.), Oil Scarlet #308 (produced by orient Chemical Industries, Ltd.), Oil Red OG (produced by Orient Chemical Industries, Ltd.), Oil Red RR (produced by Orient Chemical Industries, Ltd.), Oil Green #502 (produced by Orient Chemical Industries, Ltd.), Spiron Red BEH Special (produced by Hodogaya Chemical Co., Ltd.), m-cresol purple, Cresol Red, Rhodamine B, Rhodamine 6G, Fast Acid Violet R, Sulforhodamine B, Auramine, 4-p-diethylaminophenyliminonaphthoquinone, 2-carboxyanilino-4-p-diethylaminophenyliminonaphthoquinone, 2-carbostearylamino-4-p-dihydroxyethylamino-phenyliminonaphthoquinone, p-methoxybenzoyl-p'-diethylamino-o'-methylphenyliminoacetanilide, cyano-p-dithylaminophenyliminoacetanilide, 1-phenyl-3-methyl-4-p-diethylaminophenylimino-5-pyrazolone, 1-β-naphthyl-4-p-diethlaminophenylimino-5-pyrazolone, etc.

The radical-generating compounds used in the light-sensitive compositions according to the present invention are stable with the passage of time. However, among the color changing agents, leucotriphenylmethane dyes are generally susceptible to oxidation. It is, therefore, effective to use these dyes in the presence of certain kinds of stabilizers. To this end, amines, zinc oxide or phenols described in U.S. Pat. No. 3,042,575, sulfur compounds described in U.S. Pat. No. 3,042,516, alkali metal iodides or organic acids described in U.S. Pat. No. 3,042,518, organic acid anhydrides descriebd in U.S. Pat. 3,082,086, and triaryl compounds of antimony, arsenic, bismuth or phosphorus described in U.S. Pat. No. 3,377,167 can be effectively employed.

In the application of the light-sensitive composition in accordance with the present invention, the above-described constituting components are dissolved in a solvent, and the resulting coating solution is coated on an appropriate support by a known coating method. Preferred and particularly preferred ratios of the constituting components are shown below in terms of parts by weight per 100 parts by weight of the photosensitive resist-forming compound.

| Component | Preferred Ratio | Particularly Preferred Ratio |
|---|---|---|
| Free radical-generating agent | 0.01 to 100 | 0.1 to 50 |
| Color changing agent | 0.1 to 50 | 1 to 10 |
| Plasticizer | 0 to 1,000 | 0 to 500 |
| Binder | 0 to 5,000 | 0 to 1,000 |
| Dye or pigment other than color changing agent | 0 to 100 | 0 to 50 |
| Antifoggant | 0 to 50 | 0 to 20 |
| Sensitizer for photosensitive resist-forming compound | 0 to 50 | 0 to 20 |

The solvent which can be used for coating the light-sensitive composition according to the present invention includes ethylene dichloride, cyclohexanone, methyl ethyl ketone, methyl cellosolve acetate, monochlorobenzene, toluene, ethyl acetate, and so on. These solvents may be used alone or in combinations thereof.

The light-sensitive composition according to the present invention is suitable as a light-sensitive layer of presensitized plates from which lithographic printing plates are to be prepared. For the production of presensitized plates, the light-sensitive composition of the present invention is usually coated in an amount of from 0.1 to 10.0 g/m$^2$, and preferably from 0.5 to 5.0 g/m$^2$. Supports that are suitably used for presensitized plates can include an aluminum plate having been rendered hydrophilic, such as a silicate-processed aluminum plate, an anodically oxidized aluminum plate, a grained aluminum plate and a silicate-electrodeposited aluminum plate; as well as a zinc plate, a stainless steel plate, a chromium-processed copper plate; a plastic film having been rendered hydrophilic; and paper.

Suitable examples of the support which can be employed in producing proofs for printing, films for an overhead projector or films for a second original include transparent films, e.g., a polyethylene terephthalate film, a cellulose triacetate film, etc., including such films which have chemically or physically matted surfaces. Suitable examples of the support which can be employed in producing photomask films include a polyethylene terephthalate film on which aluminum, an aluminum alloy or chromium is vacuum-evaporated and a polyethylene terephthalate film having provided thereon a colored layer.

Further, in producing a photoresist, the supports that can be used therefor include a copper plate, a copper-plated plate, a stainless steel plate, a glass plate, etc.

It is surprising that the free radical-generating agent of the formula (I) present in a photosensitive resist-forming composition containing various photosensitive resist-forming compounds are decomposed by irradiation with light to effectively and instantly decolor the color changing agent that is copresent in the composition. As a result, there is obtained a distinct boundary between exposed areas and unexposed areas to thereby supply a visible image with high contrast.

Further, since the free radical-generating agent of the formula (I) does not seriously hinder photolysis of the photosensitive resist-forming compound, photosensitivity of the photosensitive resist-forming composition, i.e., photosensitivity of a resist, is not so reduced. In addition, the free radical-generating agent of formula (I) is effective at a small amount so that it does not deteriorate various physical properties of a resist image obtained after imagewise exposure of the composition followed by development. For example, a printing plate prepared by using the photosensitive resist-forming composition of the present invention as a light-sensitive layer of a presensitized plate has equality to a printing plate prepared without using the free radical-generating agent in terms of developability, ink-receptivity, background contamination, printing durabilityl, and like properties.

Furthermore, the free radical-generating agent of formula (I) serves as a satisfactory hydrogen drawing agent to form an acid in the presence of a hydrogen donor. Therefore, it offers a photolyzable light-sensitive composition by incorporating a compound capable of being decomposed with an acid. Such an acid-decomposable compound is described in U.S. Pat. Nos. 4,101,323, 4,247,611, 4,248,957, 4,250,247, 4,311,782 and Japanese Patent Publication (unexamined) No. 37549/1985.

A synthesis example of the free radical-generating agent that can be used in the present invention and working examples of the present invention will hereinafter be described, but it should be understood that the present invention is not limited thereto.

SYNTHESIS EXAMPLE

Synthesis of 2-(p-Diphenylacetylene)-4,6-Bis(Trichloromethyl)-s-Triazine (Compound No. 1)

4-Cyanostilbene (41 g) prepared by a known method was agitated in 300 ml of ether at room temperature, to which 33.5 g of bromine was dropwise added. After stirred for additional one hour, the reaction mixture was filtered to obtain 55.5 g of 4-cyanostilbene dibromide.

4-Cyanostilbene dibromide (50.5 g) was dissolved in 300 ml of dimethylformamide, to which 45.6 g of diazabicycloundecene was added at room temperature. Then, the reaction mixture was heated to 100° C. and kept at the temperature for 2 hours. The reaction mixture was poured into a diluted aqueous hydrochloric acid. The resulting precipitate was collected by filtration and recrystalized from methanol to give 12.0 g of 4-cyano-diphenyl acetylene.

In 50 ml of chloroform, 10 g of 4-cyano-diphenyl acetylene and 28.8 g of trichloroacetonitrile were dissolved. The solution was cooled to 5° C. and 1.3 g of aluminum bromide was added. Hydrogen chloride gas was introduced into the reaction system for one hour and the reacted for 8 hours at room temperature. The solvent was evaporated in vacuo. The residue was poured into 300 ml of ice-water to obtain crude crystal which was recrystalized from toluene to give 3.4 g of 2-(p-diphenylacetylene)-4,6-bis(trichloromethyl)-s-triazine (m.p. 200.0°–201.0° C.) (Electron spectrum λmax 345 mm in methanol)

EXAMPLE 1

Onto an aluminum plate having been grained with a nylon brush and treated with a silicate was coated a light-sensitive composition having the following composition by means of a rotatory coating machine. The coated layer was dried at 100° C. for 3 minutes to form a light-sensitive layer.

As a free-radical generating agent, there were used the compounds of the formula (I) and known compounds for comparison as shown in Table 1.

| Composition of Light-Sensitive Solution: | |
| --- | --- |
| Methyl methacrylate-methacrylic acid copolymer (85:15 by molar ratio; intrinsic viscosity in methyl ethyl ketone at 30° C.: 0.166) | 62 g |
| Pentaerythritol tetraacrylate | 38 g |
| Free-radical generating agent (as shown in Table 1) | 2 g |
| Triphenyl phosphate | 10 g |
| Ethyl cellosolve | 650 ml |
| Methylene chloride | 350 ml |

Each of the resulting light-sensitive plates was exposed to light emitted from a metal halide lamp (0.5 KW) through a step wedge (density difference between steps: 0.15; number of steps: 15) by the use of a vacuum frame and then developed with a developing solution of the following composition:

| Composition of Developing Solution: | |
| --- | --- |
| Trisodium phosphate | 25 g |
| Sodium dihydrogen phosphate | 5 g |
| Butyl cellosolve | 70 g |
| Surfactant | 2 ml |
| Water | 1 liter |

The exposure times required for obtaining images having the same density in the same step of the step wedge in each of the samples are shown in Table 1. The shorter in exposure time, the higher the sensitivity.

TABLE 1

| Run No. | Compound | Exposure Time (sec.) | Remarks |
| --- | --- | --- | --- |
| 1 | Compound No. 1 | 20 | Invention |
| 2 | Compound No. 6 | 25 | " |
| 3 | 2,4,6-tri(trichloromethyl)-s-triazine | 150 | Comparison |
| 4 | 2-(p-Methoxystyrylphenyl)-4,6-bis-(trichloromethyl)-s-triazine | 80 | " |

TABLE 1-continued

| Run No. | Compound | Exposure Time (sec.) | Remarks |
|---|---|---|---|
| 5 | 2-(p-Methoxyphenyl)-4,6-bis(tri-chloromethyl)-s-triazine | 90 | " |

As can be seen from Table 1, the compounds represented by formula (I) according to the present invention exhibit higher sensitivity than known s-triazone compounds (Run Nos. 3 to 5), indicating the superiority of the present invention.

EXAMPLE 2

The following light-sensitive solution was coated on the same aluminum plate as used in Example 1 to prepare a presensitized plate.

| Composition of Light-Sensitive Solution: | |
|---|---|
| Pentaerythritol tetraacrylate | 40 g |
| Compound No. 4 | 2 g |
| Benzyl methacrylate-methacrylic acid copolymer (73:27 by molar ratio) | 60 g |
| Methyl ethyl ketone | 400 ml |
| Methyl cellosolve acetate | 300 ml |

The resulting plate was imagewise exposed to light using a jet printer (a 2 KW ultra-high pressure mercury lamp made by Oak Seisakusho) and then developed with a developing solution having the following composition. A printing plate was obtained bearing a clear image with the unexposed area being completely removed therefrom.

| Composition of Developing Solution: | |
|---|---|
| Anhydrous sodium carbonate | 10 g |
| Butyl cellosolve | 5 g |
| Water | 1 liter |

Separately, the unexposed plate was subjected to accelerated deterioration test (45° C., 75% RH, 5 days), and then exposed to light and developed in the same manner as above. There was obtained a clear image similar to that obtained by exposing and developing the presensitized plate immediately after it was made.

EXAMPLE 3

The following light-sensitive solution was coated on the same aluminum plate as used in Example 1 to obtain a presensitized plate:

| Composition of Light-Sensitive Solution: | |
|---|---|
| Trimethylolpropane trimethacrylate | 0.30 g |
| Triethylene glycol diacrylate | 0.08 g |
| Methyl methacrylate-ethyl acrylate-methacrylic acid copolymer (80:10:10 by molar ratio) | 0.62 g |
| Compound No. 6 | 0.02 g |
| Leucocrystal Violet | 0.008 g |
| Methyl ethyl ketone | 10 g |

When the resulting presensitized plate was imagewise exposed to light, a print-out image with high contrast was obtained.

Thereafter, the unexposed area was removed with a developing solution comprising 1.2 g of sodium hydroxide, 300 ml of isopropyl alcohol and 900 ml of water, to thus obtain a lithographic printing plate.

EXAMPLE 4

Onto a grained aluminum plate having a thickness of 0.15 mm was coated the following light-sensitive solution by the use of a whirler and dried at 100° C. for 2 minutes to thereby prepare a presensitized plate.

| Composition of Light-Sensitive Solution: | |
|---|---|
| Esterification product of naphthoquinone-(1,2)-diazido(2)-5-sulfonyl chloride and pyrogallol acetone resin | 0.75 g |
| Cresol-novolak resin | 2.1 g |
| Tetrahydrophthalic anhydride | 0.15 g |
| Crystal Violet | 0.02 g |
| Free radical-generating agent (as shown in Table 2) | 0.02 g |
| Ethylene dichloride | 18 g |
| Methyl cellosolve | 12 g |

Each of the resulting samples was exposed to light using the same jet printer as used in Example 2, and the optical densities of the light-sensitive layer in the exposed area and the unexposed area were measured using a Macbeth reflection densitometer. The image obtained by exposure becomes clearer as the difference in density between the exposed area and the unexposed area ($\Delta D$) increases.

Further, these presensitized plates were forcedly deteriorated at 45° C. and 75% RH for 7 days, and the same measurement as above conducted. The results obtained are shown in Table 2.

TABLE 2

| | | Optical Density of Light-Sensitive Layer (D) | | | | | |
|---|---|---|---|---|---|---|---|
| | | One Day After Coating | | | After Accelerated Deterioration (45° C., 75% RH, 7 days) | | |
| Run No. | Free Radical-Generating Agent | Unexposed Area | Exposed Area | $\Delta D$ | Unexposed Area | Exposed Area | $\Delta D$ |
| 1 | — | 0.89 | 0.89 | 0.00 | 0.89 | 0.89 | 0.00 |
| 2 (Invention) | Compound No. 1 | 0.89 | 0.69 | 0.20 | 0.89 | 0.70 | 0.19 |
| 3 (Comparison) | 2-(p-styrylphenyl)-4,6-bis(trichloromethyl)-s-triazine | 0.89 | 0.71 | 0.18 | 0.89 | 0.72 | 0.17 |

As shown in Table 2, the presensitized plate in which the free radical-generating agent of the formula (I) was used provides a clear image having a large $\Delta D$ value. The $\Delta D$ value obtained by the present invention is higher than that obtained from the presensitized plate in which 2-(p-styrylphenyl)4,6-bis(trichloromethyl)-s-triazine was used, revealing high sensitivity of the free radical-generating agent of the formula (I).

Further, each of the exposed plates was developed with a 6-fold diluted DP-1 (a trademark for a developer for positive working presensitized plates made by Fuji Photo Film Co., Ltd.) at 25° C. for 60 seconds, and the sensitivity was determined in the same manner as described above. As a result, it was found that the sensitivity of the presensitized plate using the free radical-generating agent of the formula (I) (Table 2, Run No. 2) is equal to that of the presensitized plate in which any free radical-generating agent was not used (Table 2, Run No. 1). This shows that the free-radical generating agent of formula (I) does not reduce resist the sensitivity of a light-sensitive material.

EXAMPLE 5

The following light-sensitive solution was coated on the same aluminum plate as used in Example 4 to obtain a presensitized plate.

| Composition of Light-Sensitive Solution | |
| --- | --- |
| Esterification product of naphthoquinone-(1,2)-diazido-(2)-5-sulfonyl chloride and cresol novolak resin | 0.75 g |
| Creson novolak resin | 2.10 g |
| Tetrahydrophthalic anhydride | 0.15 g |
| Compound No. 21 | 0.01 g |
| Crystal Violet | 0.01 g |
| Oil Blue #603 (made by Orient Chemical Industries, Ltd.) | 0.01 g |
| Ethylene dichloride | 18 g |
| Methyl cellosolve acetate | 12 g |

The amount of the composition coated was 2.2 g/m$^2$ after drying.

The resulting presensitized plate provided a clear print-out image simply by imagewise exposure without development. Since the exposed area was discolored, while the unexposed area retained its initial density, the image could clearly be distinguished even by close observation under a safelight.

EXAMPLE 6

The following light-sensitive solution was coated on the same aluminum plate as used in Example 1 to obtain a presensitized plate.

| Composition of Light-Sensitive Solution: | |
| --- | --- |
| p-Toluenesulfonate of condensate between p-diazodiphenylamine and p-formaldehyde | 0.2 g |
| Polyvinyl formal | 0.75 g |
| Compound No. 22 | 0.02 g |
| N,N—Dimethylaniline | 0.02 g |
| Methyl cellosolve | 20 g |
| Methanol | 5 g |

The amount of the composition coated was 1.4 g/m$^2$ after drying.

Upon imagewise exposure, the exposed area of the plate turned to purple while the unexposed area kept its initial yellow color, whereby a print-out image that could be distinguished under a safelight even by close observation was obtained.

EXAMPLE 7

The following light-sensitive solution was coated on the same aluminum plate as used in Example 1 to prepare a presensitized plate.

| Composition of Light-Sensitive Solution: | |
| --- | --- |
| Polyester prepared by condensation of ethyl p-phenylenediacrylate and an equimole of 1,4-bis($\beta$-hydroxyethoxy)cyclohexane | 0.5 g |
| 2-Benzoylmethylene-3-methyl-$\beta$-naphthothiazoline | 0.03 g |
| Compound No. 11 | 0.008 g |
| Leucocrystal Violet | 0.008 g |
| Monochlorobenzene | 9 g |
| Ethylene dichloride | 6 g |

The amount of the composition coated was 1.3 g/m$^2$ after drying.

Upon imagewise exposure of the resulting presensitized plate, the exposed area developed a purple color, while the unexposed area maintained its original yellow color, thereby providing a print-out image that could be distinguished by close observation even under a safelight.

The light-sensitive composition of this invention contains a free-radical generating agent which is high in photolysis sensitivity and it is, therefore, high in sensitivity and can advantageously be used for the production of presensitized plates from which lithographic printing plates are to be prepared, proofs for printing, films for an overhead projector, films for a second original, photoresist and the like. The presensitized plate in which the light-sensitive composition of this invention is used provides a clear printout with high-contract even after it was stored under high temperature and high humidity conditions for a long period of time.

While the invention has been described in detail and with reference to specific embodiments thereof, it will be apparent to one skilled in the art that various changes and modifications can be made therein without departing from the spirit and scope thereof.

What is claimed is:

1. A light-sensitive composition containing a light-sensitive s-triazine compound represented by formula (I)

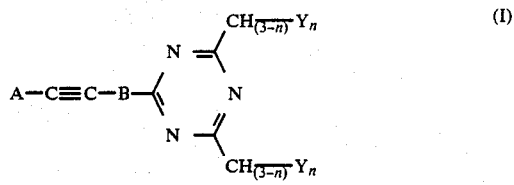

wherein A and B respresent a substituted or unsubstituted aromatic group or a substituted or unsubstituted heteroaromatic group; Y represents a chlorine atom or a bromine atom; and n represents an integer of from 1 to 3.

2. The light-sensitive composition of claim 1, wherein A represents a substituted or unsubstituted monocyclic aryl group.

3. The light-sensitive composition of claim 1, wherein B represents a substituted or unsubstituted monocyclic aryl group.

4. The light-sensitive composition of claim 1, wherein A is selected from the group consisting of a phenyl group, a 1-naphthyl group, a 2-naphthyl group, a 2-furyl group, a 2-thienyl group, a 2-oxazole group, a 2-thiazole group, a 2-imidazole group, a 2-pyridyl group, a 2-benezofuryl group, a 2-benzothienyl group, a 2-benzoxazole group, a 2-benzothiazole group, a 2-benzimidazole group, a benzotriazole group, a 2-indolyl group and a 2-quinolyl group.

5. The light-sensitive composition of claim 1, wherein A is selected from the group consisting of 4-chlorophenyl group, a 2-chlorophenyl group, a 2,6-dichlorophenyl group, a 4-bromophenyl group, a 4-nitrophenyl group, a 3-nitrophenyl group, a 4-phenylphenyl group, a 4-methylphenyl group, a 4-isopropylphenyl group, a 2-methylphenyl group, a 4-ethylphenyl group, a 4-isopropylphenyl group, a 4-butylphenyl group, a 4-methoxyphenyl group, a 2-methoxyphenyl group, a 3-methoxyphenyl group, a 4-ethoxyphenyl group, a 4-n-butoxyphenyl group, a 2-carboxyphenyl group, a 4-cyanophenyl group, a 3,4-methylene-dioxyphenyl group, a 4-phenoxyphenyl group, a 4-actoxyphenyl group, a 4-hydroxyphenyl group, a 2,4-dihydroxyphenyl group, a 4-methyl-l-napthyl group, a 4-chloro-l-naphthyl group, a 5-nitro-l-naphthyl group, a 6-chloro-2-naphthyl group, a 4-bromo-2-naphthyl group, a 5-nitro-2-naphthyl group, a 6-methyl-2-benzofuryl group, a 6-methyl-2-benzoxazole group, a 6-methyl-2-benzothiazole group, a 6-chloro-2-benzothiazole group, a 2-thienyl group, a 3-thienyl group, a 2-furyl group, a 3-furyl group, a 2-benzafuryl group and 5-(1,3-dihydroisobenzofuranyl).

6. The light-sensitive composition of claim 1, wherein B is selected from the group consisting of a 1,4-phenylene group, a 1,2-phenylene group, a 1,3-phenylene group, a 1,4-naphthylene group, a 1,5-naphthylene group, a 2,3-thienylene group and a 2,5-thienylene.

7. The photopolymerizable composition comprising a polymerizable compound having at least one ethylenically unsaturated bond and, as a free radical-generating agent, a light-sensitive s-triazine compound represented by the following formula (I)

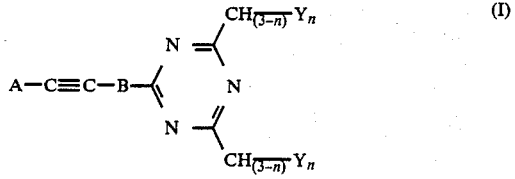

wherein A and B represent a substituted or unsubstituted aromatic group or a substituted or unsubstituted heteroaromatic group; Y represents a chlorine atom or a bromine atom; and n represents an integer of from 1 to 3.

8. The photopolymerizable composition of claim 7, wherein A represents a substituted or unsubstituted monocyclic aryl group.

9. The photopolymerizable composition of claim 7, wherein B represents a substituted or unsubstituted monocyclic acid group.

10. The photopolymerizable composition of claim 7, wherein said composition further contains a binder, a sensitizer which enhances the rate of photopolymerization when used in combination with a photopolymerization initiator of formula (I), a heat polymerization inhibitor, a dye or pigment, or a plasticizer.

11. The photopolymerizable composition of claim 7, wherein said light-sensitive s-triazine compound is present in an amount of from 0.01 to 50 parts by weight per 100 parts by weight of said polymerizable compound.

12. The photopolymerizable composition of claim 7, wherein said light-sensitive s-triazine compound is present in an amount of from 0.1 to 10 parts by weight per 100 parts by weight of said polymerizable compound.

13. The photopolymerizable composition as in claim 10, wherein said binder is present in an amount up to 1000 parts by weight, said sensitizer is present in an amount up to 100 parts by weight, said heat polymerization inhibitor is present in an amount up to 10 parts by weight, said dye or pigment is present in an amount up to 50 parts by weight, and said plasticizer is present in an amount up to 200 parts by weight, per 100 parts by weight of said polymerizable compound.

14. The photopolymerizable composition of claim 10, wherein said binder is present in an amount up to 500 parts by weight, said sensitizer is present in an amount up to 20 parts by weight, said heat polymerization inhibitor is present in an amount up to 5 parts by weight, said dye or pigment is present in an amount up to 20 parts by weight, and said plasticizer is present in an amount up to 50 parts by weight, per 100 parts by weight of said polymerizable compound.

15. A photosensitive resist-forming composition comprising a photosensitive resist-forming compound selected from the group consisting of light-sensitive diazo compounds, light-sensitive azide compounds, and compounds having an ethylenically unsaturated bond, a color changing agent and, as a free radical-generating agent, a light-sensitive s-triazine compound represented by the formula (I)

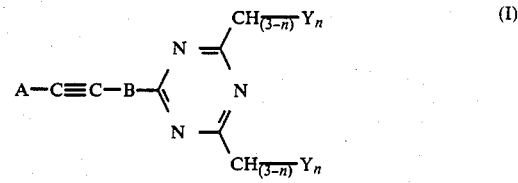

wherein A and B represent a substituted or unsubstituted aromatic group or a substituted or unsubstituted heteroaromatic group; Y represents a chlorine atom or a bromine atom; and n represents an integer of from 1 to 3.

16. The photosensitive resist-forming composition of claim 15, wherein A represents a substituted or unsubstituted monocyclic aryl group.

17. The light-sensitive composition of claim 12, wherein B represents a substituted or unsubstituted monocyclic aryl group.

18. The photosensitive resist-forming composition of claim 15, wherein said light-sensitive s-triazine compound is present in an amount of from 0.01 to 100 parts by weight, and said color changing agent is present in an amount of from 0.1 to 50 parts by weight, per 100 parts by weight of said photosensitive resist-forming compound.

19. The photosensitive resist-forming composition of claim 15, wherein said light-sensitive s-triazine compound is present in an amount of from 0.1 to 50 parts by weight, and said color changing agent is present in an amount of from 1 to 10 parts by weight, per 100 parts by weight of said photosensitive resist-forming compound.

20. The photosensitive resist-forming composition of claim 15, wherein said composition further comprises a plasticizer, a binder, dye or pigment other than the color changing agent, an antifoggant, or a sensitizer.

21. The photosensitive resist-forming composition of claim 20, wherein said plasticizer is present in an amount up to 1,000 parts by weight, said binder is present in an amount up to 5,000 parts by weight, said dye or pigment is present in an amount up to 100 parts by weight, said antifoggant is present in an amount up to 50 parts by weight, and said sensitizer is present in an amount up to 50 parts by weight, per 100 parts by weight of said photosensitive resist-forming compound.

22. The photosensitive resist-forming composition of claim 20, wherein said plasticizer is present in an amount up to 500 parts by weight, said binder is present in an amount up to 1,000 parts by weight, said dye or pigment is present in an amount up to 50 parts by weight, said antifoggant is present in an amoount up to 20 parts by weight, and said sensitizer is present in an amount up to 20 parts by weight, per 100 parts by weight of said photosensitive resist-forming compound.

* * * * *